United States Patent
Chen et al.

(10) Patent No.: US 12,075,675 B2
(45) Date of Patent: Aug. 27, 2024

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yipeng Chen, Beijing (CN); Rui Liu, Beijing (CN); Ling Shi, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/770,240

(22) PCT Filed: Mar. 19, 2021

(86) PCT No.: PCT/CN2021/081875
§ 371 (c)(1),
(2) Date: Apr. 19, 2022

(87) PCT Pub. No.: WO2022/193311
PCT Pub. Date: Sep. 22, 2022

(65) Prior Publication Data
US 2024/0147801 A1    May 2, 2024

(51) Int. Cl.
*H10K 59/35* (2023.01)
(52) U.S. Cl.
CPC ......... *H10K 59/351* (2023.02); *H10K 59/352* (2023.02); *H10K 59/353* (2023.02)

(58) Field of Classification Search
CPC ... H10K 59/351; H10K 59/352; H10K 59/353
See application file for complete search history.

(56) References Cited

U.S. PATENT DOCUMENTS

| | | | |
|---|---|---|---|
| 2014/0159009 A1 | 6/2014 | Song et al. | |
| 2014/0159022 A1 | 6/2014 | Song et al. | |
| 2016/0027368 A1 | 1/2016 | Guo et al. | |
| 2019/0035861 A1* | 1/2019 | Wang | H10K 59/38 |
| 2020/0041837 A1* | 2/2020 | Jiang | G02F 1/133609 |
| 2021/0193766 A1 | 6/2021 | Liu et al. | |

FOREIGN PATENT DOCUMENTS

| | | |
|---|---|---|
| CN | 103000638 A | 3/2013 |
| CN | 103000641 A | 3/2013 |
| CN | 103544901 A | 1/2014 |
| CN | 104465712 A | 3/2015 |
| CN | 106486513 A | 3/2017 |
| CN | 111490068 A | 8/2020 |

* cited by examiner

*Primary Examiner* — Donald L Raleigh
(74) *Attorney, Agent, or Firm* — IPro, PLLC

(57) ABSTRACT

The display substrate includes a base substrate and a plurality of pixel units disposed on the base substrate. Each of the pixel units is composed of 5 sub-pixels. The 5 sub-pixels include 1 red sub-pixel, 2 green sub-pixels, 1 blue sub-pixel and 1 white sub-pixel. Each of the sub-pixels includes a white light emitting unit. The red sub-pixel, the green sub-pixels and the blue sub-pixel further include color film layers corresponding to respective light emitting colors of the red sub-pixel, the green sub-pixels and the blue sub-pixel. The white sub-pixel is adjacent to the blue sub-pixel, and an aperture area of the blue sub-pixel is smaller than that of the green sub-pixels and smaller than that of the red sub-pixel.

16 Claims, 2 Drawing Sheets

DISPLAY SUBSTRATE AND DISPLAY APPARATUS

CROSS REFERENCE TO RELATED APPLICATIONS

The present application is a national phase entry under 35 U.S.C. § 371 of International Application No. PCT/CN2021/081875, filed on Mar. 19, 2021.

FIELD

The present application relates to the technical field of display, in particular to a display substrate and a display apparatus.

BACKGROUND

For display products, such as OLEDs, the design of pixel units will affect many aspects, such as pixel aperture ratios and display brightness, as well as product power consumption, service life and other aspects, thereby affecting the quality and performance of final products. Therefore, how to improve the design of pixel units to improve the performance and quality of the products has always been one of the key research directions for the display products.

SUMMARY

The present application discloses a display substrate and a display apparatus.

A display substrate includes a base substrate and a plurality of pixel units disposed on the base substrate. Each of the pixel units is composed of 5 sub-pixels. The 5 sub-pixels include 1 red sub-pixel, 2 green sub-pixels, 1 blue sub-pixel and 1 white sub-pixel.

Each of the sub-pixels includes a white light emitting unit. The red sub-pixel, the green sub-pixels, and the blue sub-pixel further include color film layers corresponding to respective light emitting colors of the red sub-pixel, the green sub-pixels and the blue sub-pixel.

The white sub-pixel is adjacent to the blue sub-pixel. An aperture area of the blue sub-pixel is smaller than aperture areas of the green sub-pixels and smaller than an aperture area of the red sub-pixel.

Optionally, in each of the pixel units, an overall peripheral outline shape of a pair of adjacent white sub-pixel and blue sub-pixel is substantially the same as a peripheral outline shape of the red sub-pixel.

Optionally, two adjacent sides of the pair of adjacent white sub-pixel and blue sub-pixel are fitted and matched.

Optionally, shapes of the pair of adjacent white sub-pixel and blue sub-pixel are substantially the same.

Optionally, in each of the pixel units, the sub-pixels are arranged in an order of the pair of adjacent white sub-pixel and blue sub-pixel, the green sub-pixel, the red sub-pixel, and the green sub-pixel; or, the sub-pixels are arranged in an order of the red sub-pixel, the green sub-pixel, the pair of adjacent white sub-pixel and blue sub-pixel, and the green sub-pixel.

Optionally, the display substrate includes a plurality of rows of pixel units. The two adjacent rows of pixel units are staggered, so that the red sub-pixels of the two adjacent rows of pixel units are separated, and the pairs of white sub-pixels and blue sub-pixels of the two adjacent rows of pixel units are separated.

Optionally, an overall peripheral outline of the pair of adjacent white sub-pixel and blue sub-pixel, a peripheral outline of the red sub-pixel, and a peripheral outline of each of the green sub-pixels are all square.

Optionally, the pair of adjacent white sub-pixel and blue sub-pixel are respectively rectangular.

Optionally, the display substrate is a square substrate. Sides of the overall peripheral outline shape of the pair of adjacent white sub-pixel and blue sub-pixel, sides of the peripheral outline shape of the red sub-pixel, and sides of a peripheral outline shape of each of the green sub-pixels are correspondingly parallel respectively. An extending direction of each of the sides intersects with an extending direction of a corresponding side of the display substrate.

Optionally, in the two adjacent rows of pixel units, the six adjacent green sub-pixels enclose a rectangular region. The rectangular region is composed of two square regions. The six adjacent green sub-pixels are located at six corners of two squares respectively.

In the two adjacent rows of pixel units, the white sub-pixel, the blue sub-pixel and the red sub-pixel of one pixel unit are located in the rectangular region, and a pixel circuit of the pixel unit is located in the rectangular region.

Optionally, an overall peripheral outline of the pair of adjacent white sub-pixel and blue sub-pixel, and a peripheral outline of the red sub-pixel are hexagonal; and a peripheral outline of each of the green sub-pixels is pentagonal.

Optionally, the pair of adjacent white sub-pixel and blue sub-pixel are respectively pentagonal.

Optionally, a peripheral outline shape of the white sub-pixel, a peripheral outline shape of the blue sub-pixel, and a peripheral outline shape of each green sub-pixel are each composed of an isosceles triangle and a square.

The peripheral outline shape of the red sub-pixel is composed of a square and two isosceles triangles symmetrical with respect to the square.

The isosceles triangles in the outline shapes of the sub-pixels are similar triangles.

Optionally, the display substrate is a square substrate; each side of the square in the outline shape of each sub-pixel is consistent with an extending direction of a corresponding side of the display substrate.

Optionally, in each pixel unit, an aperture ratio of the red sub-pixel is 15.35%-16.97%, an aperture ratio of the green sub-pixels is 9.58%-10.58%, and an aperture ratio of the blue sub-pixel is 5.03%-5.55%.

A display apparatus, includes the display substrate as described in any one of the above.

DETAILED DESCRIPTION OF THE EMBODIMENTS

At present, AMOLED full-color display products generally require three sub-pixel units of RGB. The three colors of sub-pixels of R/G/B are usually sequentially evaporated to corresponding driving circuits respectively through a metal mask (FMM)+an open mask (OPEN Mask). Full-color display is realized by controlling each color individually. However, as PPI gradually increases, an FMM process is gradually approaching its limit. A design for further narrowing a pixel-defined structure gap (PDL Gap) will greatly increase the difficulty of the FMM meshing process, thereby affecting the overall yield. Therefore, in order to avoid evaporation color mixing, the PDL Gap obtained in a mass production process is at least 20 μm.

In order to obtain a larger EL aperture ratio, a pixel arrangement solution of RGBG is proposed at present. Although this solution can improve an aperture ratio to a certain extent, but it still can be subject to the restriction of the FMM meshing process. In addition, the lifespan of sub-pixel light emitting units of different colors is quite different, so it is difficult to improve the overall quality and prolong the lifespan of a display panel. Further, if an aperture area of a sub-pixel of a certain color is increased to make up for the problem of the short lifespan of the sub-pixel (the current conventional pixel arrangement solution of the RGBG adopts this strategy), the brightness of three colors of RGB will be unbalanced, and the colors of a display picture will be not bright enough.

To sum up the above-mentioned research situation, the present application discloses a display substrate and a display apparatus, and aims to provide a novel pixel unit design solution, considering a plurality of aspects such as a pixel aperture ratio, power consumption, lifespan and display picture quality, thereby improving the performance and quality of display products.

The technical solutions of embodiments of the present application will be described clearly and completely below with reference to the accompanying drawings of the embodiments of the present application. Apparently, the described embodiments are some, but not all, embodiments of the present application. Based on the embodiments of the present application, all other embodiments attainable by those ordinarily skilled in the art without involving any inventive effort are within the protection scope of the present application.

The terms used herein to describe embodiments of the present disclosure are not intended to limit and/or define the scope of the present disclosure. For example, unless defined otherwise, technical terms or scientific terms used in the present disclosure shall have the ordinary meaning as understood by those ordinarily skilled in the art. It should be understood that "first", "second" and similar words used in the present disclosure do not denote any order, quantity or importance, but are only used to distinguish different components.

Figure 1:
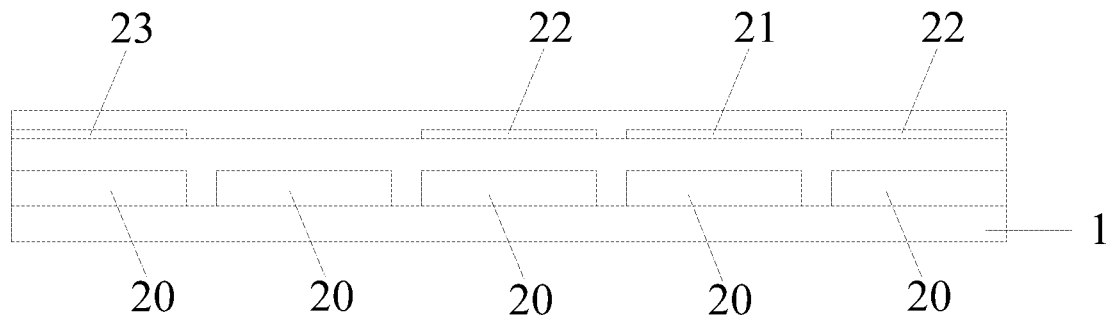
FIG. 1 is a partial structural schematic diagram of a display substrate provided by an embodiment of the present application.
Figure 2:
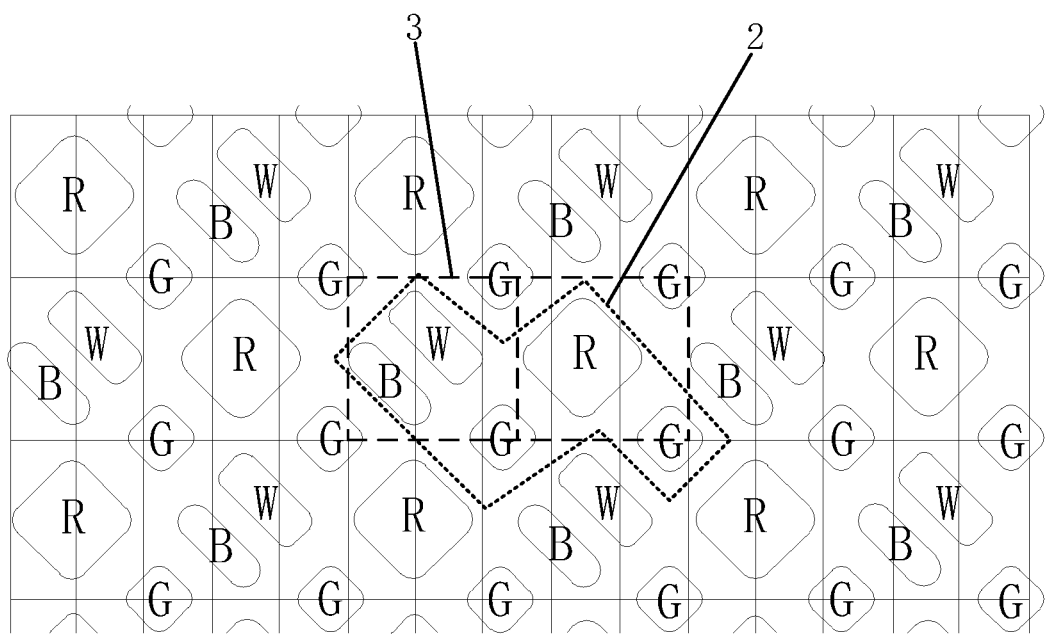
FIG. 2 is a schematic diagram of a pixel arrangement structure of a display substrate provided by an embodiment of the present application.
Figure 3:
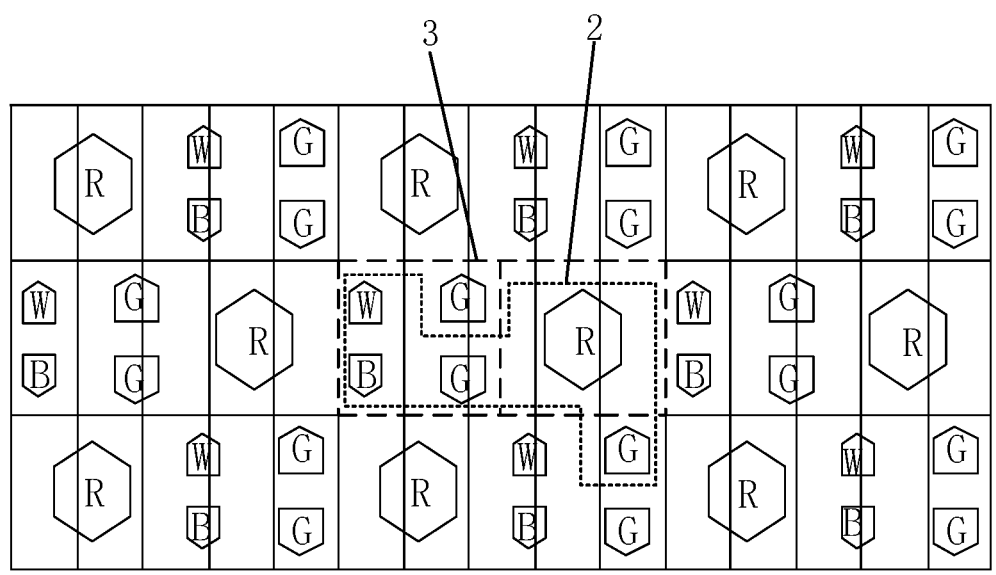
FIG. 3 is a schematic diagram of a pixel arrangement structure of a display substrate provided by another embodiment of the present application.

As shown in FIG. 1 to FIG. 3, embodiments of the present application provide a display substrate. The display substrate includes a base substrate 1 and a plurality of pixel units 2 disposed on the base substrate. Each pixel unit 2 is composed of 5 sub-pixels. The 5 sub-pixels include 1 red sub-pixel R, 2 green sub-pixels G, 1 blue sub-pixel B and 1 white sub-pixel W.

Each sub-pixel includes a white light emitting unit 20. The red sub-pixel R, the green sub-pixels G and the blue sub-pixel B also include color film layers corresponding to respective light emitting colors, for example, a red color film 21, green color films 22 and a blue color film 23 are disposed on the white light emitting units 20 of the red sub-pixel R, the green sub-pixels G and the blue sub-pixels B.

Further, the white sub-pixel W is adjacent to the blue sub-pixel B. An aperture area of the blue sub-pixel B is smaller than that of the green sub-pixels G and smaller than that of the red sub-pixel R.

First, the display substrate provided by the embodiments of the present application adopts the solution of the white light emitting units (such as WOLED)+the color films to realize full-color display, so that the use of FMM can be omitted, thus the pixel aperture size is not limited by the FMM meshing process. In this way, the PDL Gap is determined by a backplane layout (BP Layout) process, and the minimum size thereof may be 9 μm. Thus a total aperture ratio of the display substrate may be greatly increased. Moreover, each sub-pixel adopts the white light emitting unit, the lifespan is relatively balanced, and the overall lifespan of the display substrate can be effectively prolonged. In addition, all the film layers of the white light emitting units (WOLED) may be realized by uniform evaporation of OPEN Masks, which can greatly reduce the development cost.

Secondly, the display substrate provided by the embodiments of the present application is composed of five sub-pixels of RGBGW, which can greatly reduce the display power consumption compared to the conventional pixel arrangement solution of RGBG. When using the WOLED+CF solution to achieve R/G/B three-color display, each color of pixel needs to filter out the other two colors. For example, to obtain 400 nits of white light, it needs 150 nits for a pixel R, 250 nits for a pixel G, and 50 nits for a pixel B, and the brightness of each color filtered out by the color film causes a large waste of power consumption. The display substrate provided by the embodiments of the present application introduces a separate pixel W. When 400 nits of white light is required, the brightness of the pixel W is set to 200 nits, the brightness of the pixel R is only 75 nits, the brightness of the pixel G is only 125 nits, and the brightness of the pixel B is only 25 nits, so that the brightness that is wasted by filtering is greatly reduced, thereby effectively reducing the display power consumption.

Furthermore, in the display substrate provided by the embodiments of the present application, in each pixel unit 2, the aperture area of the blue sub-pixel B is smaller than that of the green sub-pixels G and smaller than that of the red sub-pixel R, and the white sub-pixel W is adjacent to the blue sub-pixel B. Thus compared with the conventional pixel arrangement of RGBG, on the one hand, a sub-pixel area of the three colors of RGB tends to be consistent with a ratio of the required brightness of the three colors, that is, the brightness of the three colors of RGB is more matched, and the combination tends to be more white light, the colors of the display picture is more bright, and the picture quality can be improved; on the other hand, a reduced area of the blue sub-pixel B compared to the green sub-pixels G and the red sub-pixel R may be configured to arrange the white sub-pixel W, and the white sub-pixel W is adjacent to the blue sub-pixel B with a smaller area, so that the sub-pixels are closely arranged, and the total aperture ratio is large. In addition, in the embodiments of the present application, the size design of the sub-pixel area of the three colors of RGB may also make a current density of the sub-pixels of each color relatively close to each other during work, so as to balance the lifespan decay of each sub-pixel light emitting unit and further prolong the lifespan of the display substrate.

To sum up, the display substrate provided by the embodiments of the present application has a larger pixel aperture ratio, lower power consumption, and longer lifespan. The colors of the display picture are bright, and the picture quality is better. Therefore, both the performance and quality of the product are higher.

It should be noted that "an area of the sub-pixel", "an aperture ratio of the sub-pixel", "an outline shape of the sub-pixel", "sides of the sub-pixel", etc. involved in the present application are all aperture parameters of the sub-pixel. For example, "an area of the sub-pixel" is an area of an aperture of the sub-pixel, "an aperture ratio of the sub-pixel" is a ratio of a sub-pixel aperture to a total aperture of the display substrate, "an outline shape of the sub-pixel" is an outline shape of the aperture of the sub-pixel, and "sides of the sub-pixel" are sides of the aperture of the sub-pixel.

In embodiments, as shown in FIG. 2 and FIG. 3, in each pixel unit 2, an overall peripheral outline shape of a pair of adjacent white sub-pixel W and blue sub-pixel B is substantially the same as a peripheral outline shape of the red sub-pixel R.

For each pixel unit 2 provided by the embodiments of the present application, when performing pixel arrangement, the pair of adjacent white sub-pixel W and blue sub-pixel B may be regarded as a whole, and be regarded as a red sub-pixel R. Furthermore, when considering the pixel shape and position layout, only an aperture shape and a layout mode of the two sub-pixels (the red sub-pixels R and the green sub-pixels G) may be considered. After designing the layout of the red sub-pixels R and the green sub-pixels G, some of the red sub-pixels R are replaced with the pair of adjacent white sub-pixel W and blue sub-pixel B at an interval. In this way, the pixel design may be simplified, and the pixels may be closely arranged, so that the design of the pixel aperture ratio is advantageously maximized. A proportion of the white sub-pixel W to the blue sub-pixel B may be appropriately adjusted as needed without affecting the overall pixel layout and total aperture ratio so as to adapt to the picture quality requirements of the display panel.

In embodiments, as shown in FIG. 2 and FIG. 3, two adjacent sides of the pair of adjacent white sub-pixel W and blue sub-pixel B may be fitted and matched. That is, a side of the white sub-pixel W adjacent to the blue sub-pixel B and a side of the blue sub-pixel B adjacent to the white sub-pixel W have the same shape, and after the two are moved and then coincide with each other, projections thereof substantially coincide. This design can maximize the aperture ratio of the pair of adjacent white sub-pixel W and blue sub-pixel B, thereby increasing the total aperture ratio of the display substrate.

Exemplarily, shapes of the pair of adjacent white sub-pixel W and blue sub-pixel B may be substantially the same.

In the embodiments of the present application, "the shapes are substantially the same", includes the situation such as the same or similar shape. It should be noted that areas or side lengths of two structures with substantially the same shape are not necessarily strictly equal, and a numerical value may be within a certain error range. For example, both are square, but four sides of the two are not correspondingly equal, and the corresponding sides are within the error range of ±5%, which may also be called the shapes of the two are substantially the same.

In embodiments, as shown in FIG. 2 and FIG. 3, in each pixel unit 2, the sub-pixels are arranged in an order of the pair of adjacent white sub-pixel W and blue sub-pixel B, the green sub-pixel G, the red sub-pixel R, and the green sub-pixel G (for example, in the pixel unit enclosed by a dotted line in FIG. 2 and FIG. 3, the sub-pixels are arranged in this order); or, the sub-pixels may also be arranged in an order of the red sub-pixel R, the green sub-pixel G, the pair of adjacent white sub-pixel W and blue sub-pixel B, and the green sub-pixel G.

Exemplarily, as shown in FIG. 2 and FIG. 3, in each pixel unit 2, a pair of green sub-pixels G have the same shape and are symmetrically disposed. In this way, the design of a backplane and the layout of the pixel units may be facilitated.

Further, the display substrate provided by the embodiments of the present application may include a plurality of rows of pixel units 2, and two adjacent rows of pixel units 2 are staggered, so that the red sub-pixels R of the two adjacent rows of pixel units 2 are separated, and the pairs of white sub-pixels W and blue sub-pixels B of the two adjacent rows of pixel units 2 are separated. For example, as shown in FIG. 2 and FIG. 3, the red sub-pixels R in the two adjacent rows are separated by one green sub-pixel G, and the pairs of white sub-pixels W and blue sub-pixels B in the two adjacent rows are separated by another green sub-pixel G.

The display substrate provided by the embodiments of the present application, as shown in FIG. 2 and FIG. 3, every 5 sub-pixels are taken as the minimum repeating unit (one pixel unit 2). The minimum repeating units are arranged in sequence in a row direction. In a column direction, two adjacent minimum repeating units are staggered, that is, the minimum repeating units of adjacent rows are not aligned. In addition, the minimum repeating units (the pixel units 2) of odd-numbered rows may be aligned, and the minimum repeating units (the pixel units 2) of even-numbered rows may be aligned.

In embodiments, as shown in FIG. 2, in each pixel unit 2, an overall peripheral outline of the pair of adjacent white sub-pixel W and blue sub-pixel B, a peripheral outline of the red sub-pixel R and a peripheral outline of each green sub-pixel G are square.

Exemplarily, as shown in FIG. 2, each sub-pixel in the pair of adjacent white sub-pixel W and blue sub-pixel B is rectangular.

The overall peripheral outline of the pair of adjacent white sub-pixel W and blue sub-pixel B is a square. Dividing line(s) parallel to the sides of the square is adopted to separate the white sub-pixel W and the blue sub-pixel B. In this way, an area of an interval between the white sub-pixel W and the blue sub-pixel B may be minimized, thereby maximizing apertures of the white sub-pixel W and the blue sub-pixel B, and increasing the total aperture ratio of the display substrate.

Exemplarily, as shown in FIG. 2, the display substrate is a square substrate. Sides of the overall peripheral outline shape of the pair of adjacent white sub-pixel W and blue sub-pixel B, sides of the peripheral outline shape of the red sub-pixel R and sides of the peripheral outline shape of each green sub-pixel G are correspondingly parallel. An extending direction of each side intersects with an extending direction of a side of the display substrate. That is, the sides of the overall peripheral outline shape of the pair of white sub-pixel W and blue sub-pixel B, the sides of the peripheral outline shape of the red sub-pixel R and the sides of the peripheral outline shape of each green sub-pixel G all intersect with the extending directions of the sides of the display substrate.

Exemplarily, corners of the peripheral outline shape of each sub-pixel may be chamfered. As shown in FIG. 2, the corners of the peripheral outline shape of the white sub-pixel W, the corners of the peripheral outline shape of the blue sub-pixel B, the corners of the peripheral outline shape of the red sub-pixel R, and the peripheral outline shape of each green sub-pixel G are all chamfered.

As shown in FIG. 2, the design of each sub-pixel in the pixel unit 2 provided by the embodiments of the present application can make each sub-pixel closely arranged, thereby increasing the total aperture ratio of the entire display substrate.

Exemplarily, as shown in FIG. 2, in the two adjacent rows of pixel units 2, six adjacent green sub-pixels G enclose a rectangular region 3. The rectangular region 3 is composed of two square regions, and the six adjacent green sub-pixels G are respectively located at six corners of the two squares.

Further, in the above-mentioned two adjacent rows of pixel units 2, the white sub-pixel W, the blue sub-pixel B and the red sub-pixel R of one pixel unit 2 are located in the above-mentioned rectangular region 3, and a pixel circuit of the pixel unit 2 is located in the rectangular region 3. For example, as shown in FIG. 2, the white sub-pixel W, the blue sub-pixel B and the red sub-pixel R in the pixel unit 2 enclosed by a dashed frame are located in the rectangular region 3 enclosed by the dashed frame. A driving circuit of each sub-pixel in the pixel unit 2 enclosed by the dashed frame is located in the above-mentioned rectangular region 3.

In embodiments, as shown in FIG. 3, in each pixel unit 2, the overall peripheral outline of the pair of adjacent white sub-pixel W and blue sub-pixel B, and the peripheral outline of the red sub-pixel R are hexagonal; and the peripheral outline of each green sub-pixel G is pentagonal.

Exemplarily, as shown in FIG. 3, each sub-pixel in the pair of adjacent white sub-pixel W and blue sub-pixel B is pentagonal.

The overall peripheral outline of the pair of adjacent white sub-pixel W and blue sub-pixel B is hexagonal, and dividing line(s) parallel to the sides of the hexagon is/are adopted to separate the white sub-pixel W and the blue sub-pixel B. In this way, an area of an interval between the white sub-pixel W and the blue sub-pixel B may be minimized, thereby maximizing apertures of the white sub-pixel W and the blue sub-pixel B, and increasing the total aperture ratio of the display substrate.

Exemplarily, as shown in FIG. 3, the peripheral outline shape of the white sub-pixel W, the peripheral outline shape of the blue sub-pixel B, and the peripheral outline shape of each green sub-pixel G are each composed of an isosceles triangle and a square. The peripheral outline shape of the red sub-pixel R is composed of a square and two isosceles triangles symmetrical with respect to the square. For example, the isosceles triangles in the outline shapes of the sub-pixels are similar triangles.

Exemplarily, the display substrate is a square substrate. An extending direction of each side of the square in the outline shape of each sub-pixel is respectively consistent with an extending direction of the corresponding side of the display substrate.

In the display substrate provided by the embodiments of the present application, some shapes of outlines of the sub-pixels are designed to be similar, angles of some corners are equal, and a reasonable layout is adopted, so that the sides and corners of each sub-pixel may be perfectly matched, close arrangement between the sub-pixels is realized, and the total aperture ratio of the display substrate is improved to the greatest degree.

In embodiments, in the display substrate provided by the embodiments of the present application, in each pixel unit 2, an aperture ratio of the red sub-pixel R is 15.35%-16.97%, an aperture ratio of the green sub-pixels G is 9.58%-10.58%, and an aperture ratio of the blue sub-pixel B is 5.03%-5.55%.

Exemplarily, the aperture ratios of the red sub-pixel R, the green sub-pixels G, and the blue sub-pixel B may be 16.16%, 10.08%, and 5.29% respectively. In other words, a ratio of areas of one red sub-pixel R to the pair of green sub-pixels G to one blue sub-pixel B may be 16.16:10.08:5.29.

For example, in the display substrate provided by the embodiments of the present application, an aperture ratio design method of each sub-pixel of RGBGW is: the required monochromatic brightness of the RGBGW is first determined, such as a/b/c/b/d, then according to the transmittance of the respective color films, the required white light brightness A/B/C/B/D is obtained, and the white light brightness A/B/C/B/D corresponds to the working current $I_A/I_B/I_C/I_B/I_D$ of the white light emitting unit (WOLED) of each sub-pixel in turn, so that the working current of each sub-pixel is divided by the light emitting area $S_R/S_G/S_B/S_G/S_W$ of each sub-pixel to obtain a current density of each sub-pixel, the current densities of respective sub-pixels are equal, and the ratio of the respective aperture ratios of the RGBGW may be obtained.

For example, in the display substrate provided by the embodiments of the present application, the aperture ratio design of each sub-pixel of RGBGW is balanced according to the respective brightness and transmittance of the color films. It is ensured that the current density of each sub-pixel is close to each other, the lifespan decay is balanced, and the lifespan of the entire pixel unit can be effectively prolonged, thereby prolonging the lifespan of the display substrate.

In addition, embodiments of the present application also provide a display apparatus, and the display apparatus includes the display substrate as described above.

The display apparatus provided by the embodiments of the present application has a larger pixel aperture ratio, lower power consumption and longer lifespan. Colors of a display picture are bright, the picture quality is good, and both product performance and quality are higher.

The display apparatus provided by the embodiments of the present application may be applied to a plurality of fields such as a mobile phone, a PAD, and display equipment.

It should be noted that, in some embodiments of the present disclosure, the display apparatus may also include other structures, which may be determined according to actual needs, which are not limited by the embodiments of the present disclosure. In addition, shapes, sizes, and specific parameters of each structure provided by the embodiments of the present disclosure are not limited to the above-mentioned embodiments, and the basic requirements may refer to the above descriptions, which will not be repeated here.

It will be apparent to those skilled in the art that various modifications and variations can be made in the present application without departing from the spirit or scope of the application. Thus, it is intended that the present application covers the modifications and variations of this application provided they come within the scope of the appended claims and their equivalents of the present application.

What is claimed is:

1. A display substrate, comprising:
    a base substrate; and
    a plurality of pixel units disposed on the base substrate;
    wherein each of the pixel units is composed of 5 sub-pixels, and the 5 sub-pixels comprise:
        1 red sub-pixel, 2 green sub-pixels, 1 blue sub-pixel, and 1 white sub-pixel;

wherein each of the sub-pixels comprises a white light emitting unit;

the red sub-pixel, the green sub-pixels, and the blue sub-pixel further comprise color film layers corresponding to light emitting colors of the red sub-pixel, the green sub-pixels, and the blue sub-pixel respectively;

the white sub-pixel is adjacent to the blue sub-pixel; and an aperture area of the blue sub-pixel is smaller than aperture areas of the green sub-pixels and smaller than an aperture area of the red sub-pixel.

2. The display substrate according to claim 1, wherein in each of the pixel units, an overall peripheral outline shape of a pair of adjacent white sub-pixel and blue sub-pixel is substantially same as a peripheral outline shape of the red sub-pixel.

3. The display substrate according to claim 2, wherein two adjacent sides of the pair of adjacent white sub-pixel and blue sub-pixel are fitted and matched.

4. The display substrate according to claim 2, wherein shapes of sub-pixels in the pair of adjacent white sub-pixel and blue sub-pixel are substantially same.

5. The display substrate according to claim 2, wherein in each of the pixel units, the sub-pixels are arranged in an order of the pair of adjacent white sub-pixel and blue sub-pixel, the green sub-pixel, the red sub-pixel, and the green sub-pixel; or, the sub-pixels are arranged in an order of the red sub-pixel, the green sub-pixel, the pair of adjacent white sub-pixel and blue sub-pixel, and the green sub-pixel.

6. The display substrate according to claim 5, wherein the pixel units are arranged in a plurality of rows, pixel units in two adjacent rows are staggered, so that red sub-pixels in the two adjacent rows are separated, and pairs of white sub-pixels and blue sub-pixels in the two adjacent rows are separated.

7. The display substrate according to claim 6, wherein an overall peripheral outline of the pair of adjacent white sub-pixel and blue sub-pixel, a peripheral outline of the red sub-pixel, and a peripheral outline shape of each of the green sub-pixels are all square.

8. The display substrate according to claim 7, wherein each sub-pixel in the pair of adjacent white sub-pixel and blue sub-pixel is rectangular.

9. The display substrate according to claim 7, wherein:

the display substrate is a square substrate;

sides of the overall peripheral outline shape of the pair of adjacent white sub-pixel and blue sub-pixel, sides of the peripheral outline shape of the red sub-pixel, and sides of the peripheral outline shape of each of the green sub-pixels are correspondingly parallel respectively; and an extending direction of each of the sides intersects with an extending direction of a corresponding side of the display substrate.

10. The display substrate according to claim 7, wherein:

in the two adjacent rows, six adjacent green sub-pixels enclose a rectangular region, the rectangular region is composed of two square regions, and the six adjacent green sub-pixels are at six corners of the two square regions respectively; and in the two adjacent rows, the white sub-pixel, the blue sub-pixel and the red sub-pixel of one pixel unit are in the rectangular region, and a pixel circuit of the pixel unit is in the rectangular region.

11. The display substrate according to claim 6, wherein an overall peripheral outline of the pair of adjacent white sub-pixel and blue sub-pixel, and a peripheral outline of the red sub-pixel are hexagonal; and a peripheral outline of each of the green sub-pixels is pentagonal.

12. The display substrate according to claim 11, wherein each sub-pixel in the pair of adjacent white sub-pixel and blue sub-pixel is pentagonal.

13. The display substrate according to claim 12, wherein:

a peripheral outline shape of the white sub-pixel, a peripheral outline shape of the blue sub-pixel, and a peripheral outline shape of each green sub-pixel are each composed of an isosceles triangle and a square;

the peripheral outline shape of the red sub-pixel is composed of a square and two isosceles triangles symmetrical with respect to the square; and the isosceles triangles in the peripheral outline shapes of the respective sub-pixels are similar triangles.

14. The display substrate according to claim 13, wherein the display substrate is a square substrate; and each side of the square in the peripheral outline shape of each sub-pixel is consistent with an extending direction of a corresponding side of the display substrate.

15. The display substrate according to any one of claim 1, wherein in each pixel unit, an aperture ratio of the red sub-pixel is 15.35%-16.97%, an aperture ratio of the green sub-pixels is 9.58%-10.58%, and an aperture ratio of the blue sub-pixel is 5.03%-5.55%.

16. A display apparatus, comprising the display substrate according to any one of claim 1.

* * * * *